United States Patent [19]

Shastry

[11] Patent Number: 4,891,091
[45] Date of Patent: Jan. 2, 1990

[54] METHOD OF EPITAXIALLY GROWING COMPOUND SEMICONDUCTOR MATERIALS

[75] Inventor: Shambhu K. Shastry, Framingham, Mass.

[73] Assignee: GTE Laboratories Incorporated, Waltham, Mass.

[21] Appl. No.: 59,441

[22] Filed: Jun. 8, 1987

Related U.S. Application Data

[63] Continuation-in-part of Ser. No. 885,343, Jul. 14, 1986, Pat. No. 4,699,688.

[51] Int. Cl.$^4$ .............................................. C30B 25/02
[52] U.S. Cl. .................................... 156/606; 156/610; 156/613
[58] Field of Search ............... 156/605, 610, 612, 613, 156/614, DIG. 70, DIG. 78; 427/51, 85, 86, 87

[56] References Cited

U.S. PATENT DOCUMENTS

| | | | |
|---|---|---|---|
| 3,370,980 | 2/1968 | Anderson | 156/610 |
| 3,725,284 | 4/1973 | Touchy | 156/605 |
| 3,963,538 | 6/1976 | Broadie et al. | 156/610 |
| 4,032,418 | 6/1977 | Antula | 156/605 |
| 4,042,447 | 8/1977 | Reitz | 156/610 |
| 4,062,706 | 12/1977 | Ruehrwein | 156/610 |
| 4,147,571 | 4/1979 | Stringfellow et al. | 156/610 |
| 4,177,298 | 12/1979 | Shigeta et al. | 156/605 |
| 4,177,321 | 12/1979 | Nishizawa | 156/606 |
| 4,255,208 | 3/1981 | Deutscher et al. | 156/610 |
| 4,368,098 | 1/1983 | Manaseuit | 156/610 |
| 4,407,694 | 10/1983 | Eu et al. | 156/613 |
| 4,504,331 | 3/1985 | Kuech et al. | 156/605 |
| 4,537,651 | 8/1985 | Shuskus et al. | 156/613 |
| 4,561,916 | 12/1985 | Akiyama et al. | 156/612 |
| 4,588,451 | 5/1986 | Vernon | 156/612 |

FOREIGN PATENT DOCUMENTS

| | | | |
|---|---|---|---|
| 0075622 | 4/1984 | Japan | 156/610 |
| 0438065 | 1/1975 | U.S.S.R. | 156/605 |

OTHER PUBLICATIONS

Mizuguchi et al., "MOCVD GaAs Growth on Ge (100) and Si (100) Substrates", J. Crys. Growth 77(1986), pp. 509–514.
Shastry et al., "Devices on GaAs Directly Grown on (100)-Si By Low Pressure Metalorganic Vapor Phase Epitaxy", 3rd Int. Workshop on the Physics of Semiconductor Devices, Madrus, India, 1985.
Christou et al., "Low Temperature Epitaxial Growth of GaAs on (100) Silicon Substrates", Electronics Letters 21 (1985), pp. 406–408.
Akiyama et al., "Growth of High Quality GaAs Layers on Si Substrates by MOCVD", J. Crys. Growth 77(1986), pp. 490–497.
Akiyama et al., "Growth of GaAs on Si by MOCVD", J. Crys. Growth 68 (1984), pp. 21–26.
Norris et al., "Reduced Pressure MOVPE Growth and Characterization . . .", 68 (1984), pp. 437–444.
Tsaur et al., "Molecular Beam Epitaxy of GaAs and AlGaAs on Si", Appl. Phys. Lett. 45 (1984), pp. 535–536.
Zemon et al., "Photoluminescence and Photoluminescence Excitation Spectra of GaAs Grown Directly on Si", 58 (1986), pp. 457–460, Solid State Comm.

Primary Examiner—Gary P. Straub
Assistant Examiner—R. Bruce Breneman
Attorney, Agent, or Firm—James J. Cannon, Jr.; David M. Keay

[57] ABSTRACT

Method of MOVPE growing a compound semiconductor material, for example GaAs, on a substrate, for example Si. Sodium ions are first introduced onto the substrate surface as by immersing it in a cleaning solution containing sodium. A two-step MOVPE process is then employed to grow device quality single crystal compound semiconductor material on the surface of the substrate.

16 Claims, 2 Drawing Sheets (a)  (b)

METHOD OF EPITAXIALLY GROWING COMPOUND SEMICONDUCTOR MATERIALS

CROSS-REFERENCE TO RELATED APPLICATIONS

This application is a continuation-in-part of application Ser. No. 885,343 filed July 14, 1986, by Shambhu K. Shastry entitled "Method of Epitaxially Growing Gallium Arsenide on Silicon" and assigned to the assignee of the present application, now U.S. Pat. No. 4,699,688.

BACKGROUND OF THE INVENTION

This invention relates to semiconductor materials. More particularly, it is concerned with methods of epitaxially growing a semiconductor material on a substrate of the same or a different material.

In the fabrication of compound semiconductor devices and integrated circuits which include compound semiconductor devices, it is necessary to epitaxially grow layers of single crystal compound semiconductor materials directly on substrates of insulating and semiconducting materials. Metalorganic vapor phase epitaxy (MOVPE) techniques have been employed for this purpose.

The density of dislocations in the single crystal structure of III-V compound semiconductor materials is high compared to silicon. The dislocations are due to thermally induced stress while the bulk crystal is cooling from its growth temperature. These dislocations are present in wafers or substrates produced from the bulk crystal, and propagate in material epitaxially grown on the substrates. It has been even more difficult to obtain satisfactory device grade layers of III-V compound semiconductor materials grown on substrates of different materials, for example, silicon and sapphire. Although some techniques such as introducing strained layer superlattice structures have been employed to reduce the dislocation density in epitaxially grown III-V compound materials, additional complications are inherent with these structures.

SUMMARY OF THE INVENTION

The improved method of epitaxially growing a compound semiconductor material on a substrate in accordance with the present invention comprises providing a substrate having exposed surface areas. Sodium ions are introduced onto the surface areas of the substrate. Then, single crystal compound semiconductor material is grown on the surface areas of the substrate by employing metalorganic vapor phase epitaxial techniques.

The presence of the sodium ions during the epitaxial growth process greatly improves the reproducibility of the process in obtaining low dislocation density, single domain compound semiconductor layers directly on insulating and semiconducting substrates.

Figure 1:
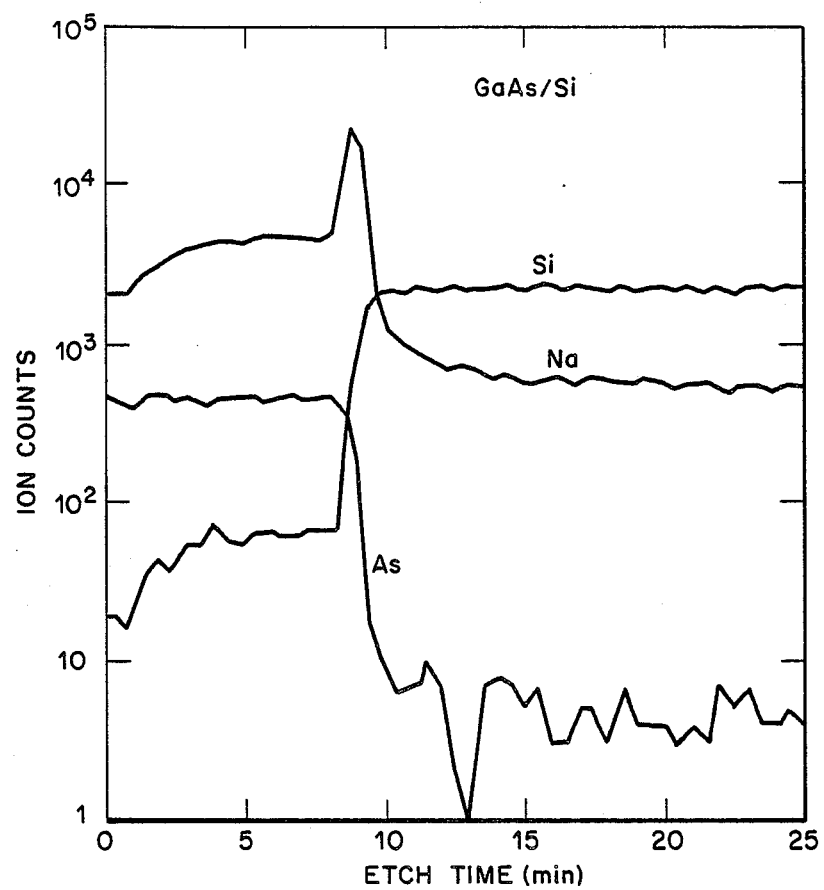
FIG. 1 is a profile of the distribution of As, Si, and Na ions in a sample of MOVPE-grown GaAs on a substrate of silicon in accordance with the present invention.

For a better understanding of the present invention, together with other and further objects, advantages, and capabilities thereof, reference is made to the following disclosure and appended claims in connection with the above-described drawings.

DETAILED DESCRIPTION

The present invention is concerned with the epitaxial growth of semiconductor materials on substrates of essentially single crystal semiconducting or insulating materials. More specifically, the method is directed to the MOVPE growth of compound semiconductor materials on substrates of compound semiconductor materials, silicon, and $Al_2O_3$. The compound semiconductor materials of concern includes III-V compound semiconductor materials such as GaAs, InP, InAs, InGaAs, GaAlAs, and InGaAsP, and also combinations thereof which form III-V heterojunction materials such as GaAlAs/GaAs and InGaAsP/InP. The method may also be employed for the homo-epitaxial and hetero-epitaxial growth of II-VI compound semiconductor materials. Various conductivity type imparting materials may be introduced into compound semiconductor materials to establish the desired conductivity characteristics of regions thereof. Typical conductivity type imparting materials include silicon, sulphur, tellurium, selenium, beryllium, zinc, cadmium, and magnesium.

The substrate and epitaxially grown material may be the same, for example gallium arsenide on gallium arsenide, or may be different, for example gallium arsenide on silicon or $Al_2O_3$ (sapphire). In order for the epitaxially grown material to be of device quality the substrate is essentially single crystal material. Substrates of $Al_2O_3$ (sapphire or alumina) may have a large number of discontinuities in their single crystal structure relative to single crystal silicon and still be considered as essentially single crystal for the purpose of serving as a substrate for the growth of hetero-epitaxial layers of compound semiconductor materials.

In practicing the method of the invention for the homo-epitaxial or hetero-epitaxial growth of compound semiconductor materials, a trace amount of sodium (Na) ions is introduced onto the surface of the substrate which is to become the interface between the substrate and the epitaxially grown compound semiconductor material. The sodium may be present in the amount of one or two monolayers. The sodium-treated substrate is processed in accordance with generally known MOVPE techniques, and preferably the two-step MOVPE process as disclosed in the aforementioned application of Shambhu K. Shastry may be employed.

An effective procedure for treating substrates prior to the epitaxial growth process in order to provide the desired amount of sodium ions is to introduce the sodium by way of the otherwise conventional cleaning solution. The sodium ions may be in the form of Na, NaCl, NaF, or NaOH dissolved in the cleaning solution. Sodium ions are present in the solution in the amount of approximately 1 percent by weight of the solution. More specifically, Na, NaCl, or NaF is added to the 20% HCl solution which is conventionally employed to clean gallium arsenide substrates. Typically, silicon substrates are cleaned with a 20% solution of HF. In accordance with the present invention NaF is added to the dilute HF solution. For cleaning sapphire ($Al_2O_3$) substrates Na, NaOH, or NaF is added to the de-ionized water typically used. It is important that the sodium-based reagent employed be of high purity, preferably 99.99% or better. The metallic impurities which are known to be exceptionally detrimental to semiconductor devices such as iron, magnesium, beryllium, etc. must be at a minimum, since these impurities are electrically active in gallium arsenide.

Additionally, applying an anodic bias of 3 to 5 volts to the substrate during this treatment enhances the introduction of sodium ions onto the surface. The electrochemical potential of sodium ions with respect to a hydrogen electrode is about $-2.718$ volts, and thus the natural tendency for the positive sodium ions would be to become neutral. The anodic bias of greater than 2.718 volts decreases this natural tendency, thereby increasing the concentration of sodium ions on the surface of the substrate.

After receiving the sodium treatment, a substrate is placed in an introductory chamber of an MOVPE reactor which is pumped down and flushed several times with argon. The substrate is then transferred into the reaction chamber and placed on a graphite susceptor. The graphite susceptor is heated by RF energy applied to induction heating coils encircling the quartz reactor tube.

More specifically, when a a homo-epitaxial layer of gallium arsenide on gallium arsenide is grown in accordance with the method of the invention, a single crystal gallium arsenide substrate is treated by immersing in a 20% HCl solution containing approximately 1% by weight sodium in the form of Na, NaCl, or NaF. A potential of 3 volts is applied to the substrate with respect to a platinum electrode also immersed in the solution. Treatment is carried on for 10-15 seconds, and then the substrate is blow dried.

The gallium arsenide substrate is placed in the MOVPE reactor and the pressure is reduced to 25-50 torr. The temperature of the substrate is raised and when it reaches 300° C, arsine (10% $AsH_3$ in hydrogen) is introduced at a rate of 56 standard cubic centimeters per minute (sccm). The temperature is raised to 600° C, and triethylgallium (2% TEG in hydrogen) is also introduced into the reactor chamber at a rate of 125 sccm. The vapors containing the constituent elements are carried into the reactive chamber with a hydrogen carrier gas flow rate of 5 standard liters per minute (slm). Under these conditions the gallium arsenide grows at a rate of about 40 nanometers per minute and layers of between 10 and 12 microns are grown in four to five hours. Silicon-doped gallium arsenide layers are grown by introducing silane (2.0% $SiH_4$ in hydrogen), together with the arsine and triethylgallium, while heating the substrate while immersed in a 20% HF solution containing approximately 1% by weight of sodium ions provided by the addition of NaF or NaCl to the solution.

The treated substrate is then placed in an MOVPE reactor chamber and processed in accordance with the teachings of the aforementioned application of Shambhu K. Shastry. The pressure is reduced to between 25 torr and 50 torr, preferably about 40 torr, and the temperature of the substrate is raised. When the temperature reaches about 300° C., arsine (10% $AsH_3$ in hydrogen) is admitted to the chamber at a rate of 56 sccm. When the temperature becomes stabilized between 425° C. and 450° C., preferably at about 450° C., triethylgallium (2% TEG in hydrogen) is introduced into the reactor chamber at a flow rate of 8 sccm. The ratio of arsenic atoms to gallium atoms admitted to the reactor chamber is about 300 to 1, and desirably is not lower than about 200 to 1. The conditions within the reactor chamber are such that the growth rate of gallium arsenide on the silicon substrate is at about 3 nanometers per minute. These conditions are maintained from about 2 to 3 minutes to produce a seed layer of about 5 to 10 nanometers thick. The substrate temperature is raised to a temperature of between 575° C and 650° C, preferably to about 600° C (650° C if the gallium arsenide is being doped with silicon from silane). The flow rate of arsine vapor is held the same, and the flow rate of the triethylgallium-hydrogen mixture is raised to 125 sccm. Under these conditions a gallium arsenide buffer layer is grown at a rate of about 40 nanometers per minute. These conditions may be maintained as long as desired to obtain a layer of gallium arsenide of the desired thickness.

Figure 2:
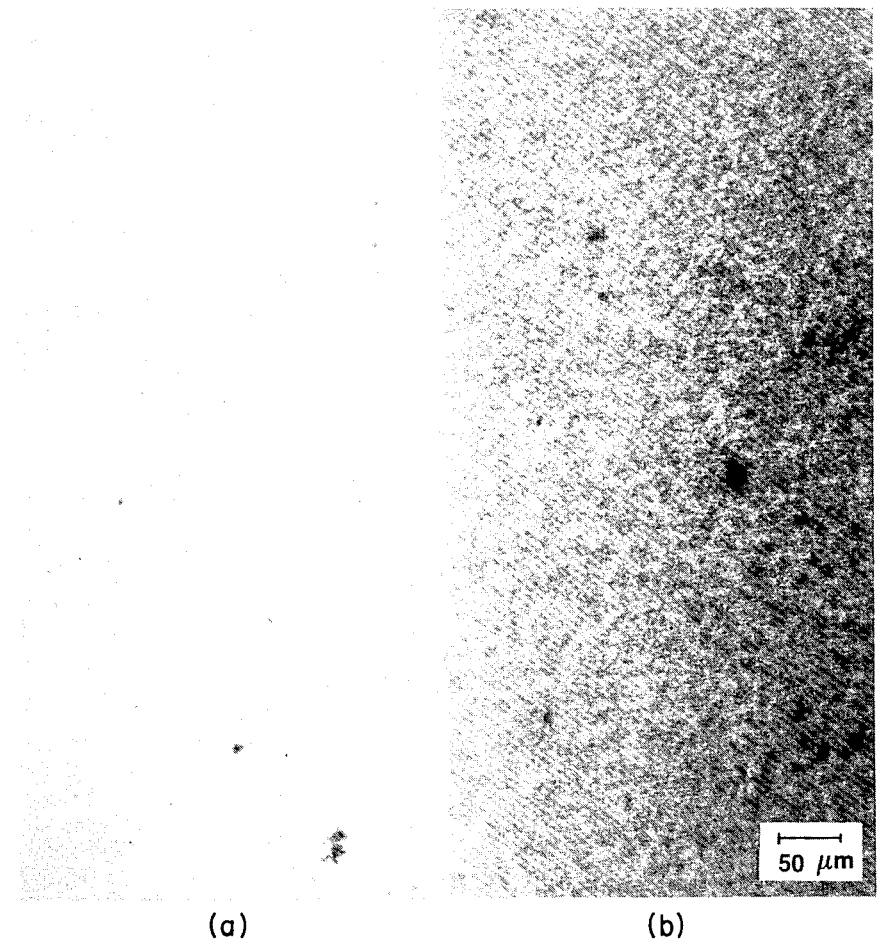
FIG. 2 are photomicrographs illustrating the surface morphology of (a) a sample of MOVPE-grown GaAs on a sodium-treated substrate of silicon in accordance with the method of the present invention, and (b) a sample of MOVPE-grown GaAs on a substrate of silicon not treated with sodium.

The gallium arsenide layers thus grown are of single domain and have very low dislocation densities, FIG. 1 illustrates the depth profile of Na, Si, and As in a 1 micron thick GaAs epitaxial layer grown on a (100) silicon substrate as determined by secondary ion mass spectrometry techniques (SIMS). The sample was produced in accordance with the two-step MOVPE method as previously described. As may be noted from FIG. 1, a high Na peak is observed at the GaAs-Si interface. FIG. 2 is a photomicrograph showing the surface morphology of samples of gallium arsenide grown on silicon and subjected to a preliminary sodium treatment in accordance with the invention (a) and without the preliminary sodium treatment (b). The sodium-treated sample produced a mirror-like, smooth, epitaxial gallium arsenide layer without any detectable antiphase domains. The layer grown without the sodium treatment was hazy to the naked eye and consisted of antiphase domains.

Typically, in their simplest form the antiphase boundaries in III-V compound semiconductor materials exist at two adjacent planes of Group III or Group V atoms. That is, they are electrically charged planes of imperfections. When epitaxially growing gallium arsenide on a silicon substrate, after the formation of the initial monolayer of GaAs, the crystal steps on the silicon surface effectively cause the formation of gallium arsenide with differing polarity over the adjacent steps. As a result antiphase domain boundaries form over the edges of the steps. It is theorized that in treating the substrate in accordance with the present invention the presence of sodium ions at or near the steps probably reduces polarity reversal situations and thus reduces the density of antiphase domains. It is also probable that as sodium is incorporated into the growing epitaxial gallium arsenide layer, sodium anions move and bond to arsenic cations at the antiphase boundaries. Relative to sodium, gallium in gallium arsenide is anionic, and thus sodium cations would move and bond to gallium anions. This action would completely block the movement of the antiphase boundaries, since one of the rows of the Group III or Group V atoms is neutralized by sodium ions in this manner. Since sodium ions are known to be quite mobile in amorphous media, and in the initial state during nucleation, gallium arsenide tends to be amorphous due to the randomness in the nucleation process, sodium ions could be mobile during this stage of the process.

Dislocations are line defects in the crystal structure and hence form a subset of antiphase boundaries. It is probable that the sodium attachment process reduces or eliminates dislocations in the same manner as it does the antiphase boundaries. In the initial stages of gallium arsenide epitaxial growth on silicon or sapphire, dislocations are formed first, and lateral accumulation of dislocations then essentially seeds the antiphase boundary. Thus, if the formation of dislocations in the initial first or second atomic layers is suppressed, antiphase boundaries can be considered to be absent altogether. It is probable that the presence of sodium ions on the substrate surface accomplishes this purpose. It is also possible that both the As-Na and Ga-Na bonds are more ionic than the As-Ga bonds in gallium arsenide. That is, the sodium ions do not need to place themselves rigidly in certain angular and spatial positions. This ionic character of the bonds thus would help relax the lattice mismatch between the substrate material and the epitaxial material thereby reducing the dislocation density at the interface.

Although certain specific combinations of substrates and epitaxially grown layers have been discussed hereinabove, the method of the invention can be extended to other hetero-epitaxial structures. The basic necessity is to overcome the problem of lattice mismatch and interface charge imbalance problems during the formation of the first or second monolayer of the epitaxially grown material. By introducing sodium ions onto the substrate surface in accordance with the present invention these problems are removed permitting the epitaxial growth of compound semiconductor materials with the improved results as discussed hereinabove.

The electrical quality of epitaxial gallium arsenide layers grown in accordance with the present invention do not degrade. Electron mobility of about 8,000 $cm^2/V$-s at 300 K, 210,000 $cm^2/V$-s at 77 K, and peak mobility of 309,000 $cm^2/V$-s at 42 K have been measured in homo-epitaxial gallium arsenide layers grown at a temperature of 650° C.. In addition, characterization of these layers using 4.2 K photoluminescense indicates high optical quality of the epitaxial material.

While there has been shown and described what are considered preferred embodiments of the present invention, it will be obvious to those skilled in the art that various changes and modifications may be made therein without departing from the invention as defined by the appended claims.

What is claimed is:

1. The method of epitaxially growing a compound semiconductor material on a substrate comprising
    providing a substrate of essentially single crystal insulating or semiconducting material having exposed surface areas; and
    introducing sodium ions onto said surface areas; and
    metalorganic vapor phase epitaxially growing single crystal compound semiconductor material on said surface areas of the substrate to form an interface with the substrate while incorporating sodium ions in the single crystal structure of the growing single crystal compound semiconductor material.

2. The method in accordance with claim 1 wherein introducing sodium ions onto said surface areas includes
    immersing said substrate in a liquid solution containing sodium ions.

3. The method in accordance with claim 2 wherein a positive potential is applied to said substrate while the substrate is immersed in the liquid solution.

4. The method in accordance with claim 3 wherein metalorganic vapor phase epitaxially growing single crystal compound semiconductor material on said surface areas of the substrate includes
    placing the substrate in a chamber; and introducing a first vapor containing one constituent element of the compound semiconductor material and a second vapor containing another constituent element of the compound semiconductor material into the chamber while heating the substrate to grow a single crystal layer of the compound semiconductor material on said areas of the substrate.

5. The method in accordance with claim 4 wherein said liquid solution contains approximately 1 percent sodium by weight.

6. The method of epitaxially growing a compound semiconductor material on a substrate comprising
    providing a substrate of essentially single crystal insulating or semiconducting material having exposed surface areas;
    placing the substrate in a chamber;
    introducing a first vapor containing one constituent element of the compound semiconductor material and a second vapor containing another constituent element of the compound semiconductor material into the chamber while heating said substrate at a first temperature to grow a first relatively thin layer of single crystal compound semiconductor material on the exposed surface areas of the substrate to form an interface with the substrate while incorporating sodium ions in the single crystal structure of the growing single crystal compound semiconductor material during a first deposition step;
    increasing the temperature of the substrate to a second temperature; and
    introducing said first vapor and said second vapor into the chamber while heating said substrate at said second temperature to grow a second relatively thick layer of single crystal compound semiconductor material on said first layer of single crystal compound semiconductor material during a second deposition step.

7. The method in accordance with claim 6 wherein introducing sodium ions onto said surface areas includes
    immersing said substrate in a liquid solution containing sodium ions.

8. The method in accordance with claim 7 wherein said substrate is of essentially single crystal silicon, III-V compound semiconductor material, or $Al_2O_3$.

9. The method in accordance with claim 8 wherein said compound semiconductor material is gallium arsenide.

10. The method in accordance with claim 9 wherein said first vapor includes arsine; and
    said second vapor includes triethylgallium.

11. The method in accordance with claim 10 wherein said first temperature is between 425° C. and 450° C.; and
    said second temperature is between 575° C. and 650° C..

12. The method in accordance with claim 11 wherein during said first deposition step said first vapor and said second vapor are introduced at a rate causing said first layer to grow in thickness at a growth rate of about 3 nanometers per minute; and
    during said second deposition step said first and second vapors are introduced at a rate causing said second layer to grow in thickness at a growth rate of about 40 nanometers per minute.

13. The method in accordance with claim 12 including prior to said first deposition step introducing said first vapor into the chamber.

14. The method in accordance with claim 13 wherein said first deposition step is carried on for a period of from 2 to 3 minutes and a first layer of from 5 to 10 nanometers is grown.

15. The method in accordance with claim 11 wherein during said first deposition step the ratio of arsenic atoms to gallium atoms introduced into the chamber is at least 200 to 1.

16. The method in accordance with claim 15 including prior to said first deposition step introducing said first vapor into the chamber.

* * * * *